(12) United States Patent
Pfeiffer et al.

(10) Patent No.: US 9,911,881 B2
(45) Date of Patent: Mar. 6, 2018

(54) THIN-FILM PHOTOVOLTAIC DEVICE WITH WAVY MONOLITHIC INTERCONNECTS

(71) Applicant: FLISOM AG, Dübendorf (CH)

(72) Inventors: Reto Pfeiffer, Pfäffikon (CH); Roger Ziltener, Sursee (CH); Thomas Netter, Winterthur (CH)

(73) Assignee: FLISOM AG, Niederhasli (CH)

( * ) Notice: Subject to any disclaimer, the term of this patent is extended or adjusted under 35 U.S.C. 154(b) by 448 days.

(21) Appl. No.: 14/388,022

(22) PCT Filed: Mar. 27, 2013

(86) PCT No.: PCT/IB2013/052441
§ 371 (c)(1),
(2) Date: Sep. 25, 2014

(87) PCT Pub. No.: WO2013/150418
PCT Pub. Date: Oct. 10, 2013

(65) Prior Publication Data
US 2015/0214409 A1   Jul. 30, 2015

(51) Int. Cl.
*H01L 31/05* (2014.01)
*H01L 31/0465* (2014.01)
(Continued)

(52) U.S. Cl.
CPC ...... *H01L 31/0516* (2013.01); *G06F 17/5077* (2013.01); *H01L 31/0201* (2013.01);
(Continued)

(58) Field of Classification Search
CPC ... H01L 31/00; H01L 31/02; H01L 31/02002; H01L 31/02008; H01L 31/0201;
(Continued)

(56) References Cited

U.S. PATENT DOCUMENTS 4,228,315 A * 10/1980 Napoli ............ H01L 31/022433
136/256
2008/0156372 A1 * 7/2008 Wu .................. H01L 31/022425
136/260
(Continued)

FOREIGN PATENT DOCUMENTS

EP           2309540 A1    4/2011
WO      2011/061950 A1    5/2011

OTHER PUBLICATIONS

Resistance and resistivity. Retrieved from http://resources.schoolscience.co.uk/CDA/16plus/copelech2pg1.html on Jun. 9, 2017.*
(Continued)

*Primary Examiner* — Christina Chern
(74) *Attorney, Agent, or Firm* — Patterson & Sheridan, LLP

(57) ABSTRACT

A thin-film optoelectronic module device (100) and design method comprising at least three monolithically-interconnected cells (104, 106, 108) where at least one monolithically-interconnecting line (250) depicts a spatial periodic or quasi-periodic wave and wherein the optoelectronic surface of said thin-film optoelectronic module device (100) presents at least one set of at least three zones (210, 220, 230) having curves of substantially parallel monolithic interconnect lines. Border zones (210, 230) have a lower front-contact sheet resistance than that of internal zone (220). Said curves of substantially parallel interconnecting lines may comprise peaks of triangular or rounded shape, additional spatial periods that are smaller than a baseline period, and mappings from one curve to the adjacent curve such as in the case of non-rectangular module devices (100). The device (100) and design method are advantageous to reduce costs and materials to manufacture thin-film optoelectronic mod-
(Continued)

ule devices (100) while increasing production yield, reliability, aesthetic appearance, and range of applications.

11 Claims, 8 Drawing Sheets

(51) Int. Cl.
  *H01L 31/0352* (2006.01)
  *H01L 31/0463* (2014.01)
  *H01L 31/0224* (2006.01)
  *H01L 31/046* (2014.01)
  *G06F 17/50* (2006.01)
  *H01L 31/02* (2006.01)

(52) U.S. Cl.
  CPC .......... *H01L 31/022433* (2013.01); *H01L 31/035272* (2013.01); *H01L 31/046* (2014.12); *H01L 31/0463* (2014.12); *H01L 31/0465* (2014.12); *H01L 31/0508* (2013.01); *Y02E 10/50* (2013.01)

(58) Field of Classification Search
  CPC .......... H01L 31/0224; H01L 31/022425; H01L 31/022433
  See application file for complete search history.

(56) References Cited

U.S. PATENT DOCUMENTS

2008/0289680 A1* 11/2008 MacFarlane .......... H01L 31/024
                                                        136/246
2011/0061706 A1    3/2011 Park et al.
2011/0265845 A1* 11/2011 Nasuno ................. H01L 31/02
                                                        136/244
2012/0234375 A1    9/2012 Nakamura et al.

OTHER PUBLICATIONS

International Search Report and Written Opinion, PCT/IB2013/052441, dated Nov. 15, 2013.

* cited by examiner

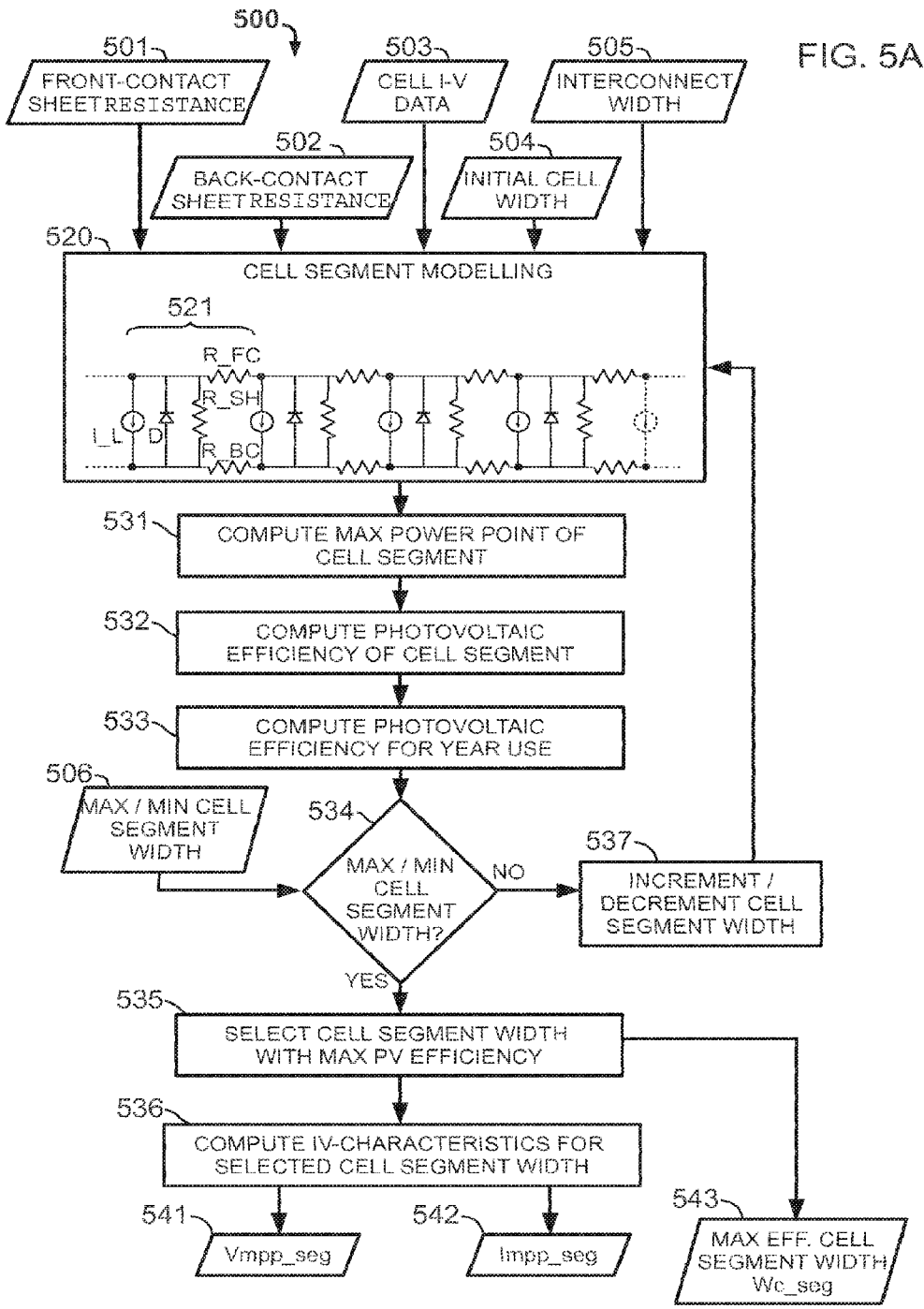

THIN-FILM PHOTOVOLTAIC DEVICE WITH WAVY MONOLITHIC INTERCONNECTS

FIELD OF THE INVENTION

The present invention relates to photovoltaic devices manufactured by deposition of thin-films and more particularly to the design of monolithic interconnects between cells within a photovoltaic module.

BACKGROUND OF THE INVENTION

Photovoltaic devices are generally understood as photovoltaic cells or photovoltaic modules. Photovoltaic modules ordinarily comprise arrays of interconnected photovoltaic cells.

Thin-film photovoltaic modules, a variety of which is also known as thin-film solar modules, are generally composed of a number of electrically interconnected optoelectronic components. Such components may be optoelectronic devices such as photovoltaic cells and additional optional components such as diodes and other electronic devices.

Multilayer thin-film technologies enable the monolithic integration and interconnection of several optoelectronic components and associated components on a same substrate. This integration is produced in situ using a sequence of layer deposition and scribing techniques. Thin-film optoelectronic or photovoltaic components or devices are essentially composed of a stack of three material layers: a conducting back-contact electrode layer, a semiconductive photovoltaic material layer, also known as the absorber, and another conducting front-contact electrode layer, said front-contact layer usually being transparent. Photovoltaic cells based on semiconductive material such as $Cu(In,Ga)Se_2$ (CIGS) or CdTe show promise for less expensive solar electricity, lower energy payback time, and improved life-cycle impact as compared to traditional wafer-based silicon photovoltaic devices or solar cells.

Compared to wafer-based photovoltaic devices, monolithic photovoltaic modules may have lower costs thanks to reduced material quantities used by thin films, reduced labor costs of monolithic integration, and ease of automatic production of large quantities of photovoltaic modules, for example using roll-to-roll manufacturing techniques. Further savings can be obtained by increasing the relative area of photovoltaic components exposed to light, for example by reducing the area occupied by front-contact grids that collect current over the photovoltaic cell's front-contact electrode, electrical interconnects between optoelectronic components, and busbars. Photovoltaic module production yields may also be increased thanks to a reduction in the number of production steps, for example by reducing or eliminating the step where front-contact grids are added.

Monolithic interconnects are customarily composed in the prior art of mostly parallel scribing lines. The present invention describes a class of monolithic interconnects made of wavy scribing lines. The waviness of said monolithic interconnects in some regions of the photovoltaic module may be tuned to the zonal sheet resistance of the front-contact layer. Such wavy monolithic interconnects may be advantageous for certain applications and module sizes and reduce the need for front-contact grid fingers. The invention is also especially advantageous for thin-film CIGS photovoltaic modules and presents embodiments where photovoltaic modules are not rectangular

SUMMARY OF THE INVENTION

Monolithic interconnects are customarily composed in the prior art of mostly parallel scribing lines. The present invention describes a class of monolithic interconnects made of wavy scribing lines. The waviness of said monolithic interconnects in some regions of the photovoltaic module may be tuned to the zonal sheet resistivity of the front-contact layer. Such wavy monolithic interconnects may be advantageous for certain applications and module sizes and reduce the need for front-contact grid fingers. The invention is also especially advantageous for thin-film CIGS photovoltaic modules and presents embodiments where photovoltaic modules are not rectangular.

This invention presents solutions to the problem of manufacturing high efficiency thin-film photovoltaic devices, especially flexible photovoltaic devices, and more precisely lower-cost, more reliable, and more customizable photovoltaic modules. It is especially advantageous for roll-to-roll manufacturing of photovoltaic modules.

An object of the invention is to provide methods to design and manufacture a class of photovoltaic devices featuring wavy monolithic interconnects. The distance between monolithic interconnect lines between photovoltaic cells of photovoltaic modules is a function of many parameters such as electrical current, front-contact sheet resistance, the presence of front-contact grid elements to increase conductivity, and monolithic interconnect resistivity. The invention therefore presents solutions based on wavy monolithic interconnects to design photovoltaic modules featuring few or no front-contact grids while providing photovoltaic module designers with a new method to design lower-cost photovoltaic modules of various sizes and shapes.

A first problem in the field of thin-film photovoltaic devices is that the transparent front-contact layer has a relatively high sheet resistance. Collection of electrons generated by the photovoltaic device is usually improved by adding a conductive grid onto the front-contact. Grid fingers are designed to collect electrons generated within their vicinity. The size and shape of this vicinity depends on several parameters, the most important of which are transparent front-contact sheet resistance and grid shape. Design of efficient photovoltaic cells and modules therefore requires the design of grids that are optimized to the shape and function of the photovoltaic modules and the interconnected cells that compose it.

A second problem in the field of thin-film photovoltaic devices is that depositing a grid onto the front-contact requires a manufacturing step such as screen printing. This step represents additional costs, requires specific machines, and as such may reduce production yield.

A third problem in the field of thin-film photovoltaic devices is that the grid, because it is opaque and deposited onto the transparent front-contact, must be made as narrow as possible so as to minimize masking of the underlying semiconductor absorber layer where photovoltaic conversion occurs. The grid, although it increases overall collection of charges, reduces the amount of photovoltaic conversion within the absorber layer.

A fourth problem in the field of thin-film photovoltaic devices is that the grid may not bind perfectly with the front-contact layer and imperfections in the interface may present locations with substandard conductivities, thereby reducing the local benefit of a given grid segment or finger.

A fifth problem in the field of flexible thin-film photovoltaic devices is that they are encapsulated between adhesive flexible sheets. The front transparent sheet therefore adheres to the grid. As the module is flexed or subject to strain, for example through differential thermal expansion, the front transparent sheet may cause strain on the grid, rupture the contact between grid and front-contact, and therefore reduce the overall module's photovoltaic efficiency and reliability.

A sixth problem in the field of thin-film photovoltaic devices is that photovoltaic modules having a large distance between anode and cathode and comprising monolithic serially-interconnected cells may have a high voltage due to the large number of narrow cells interconnected between the module's anode and cathode.

A seventh problem in the field of photovoltaic devices is that a uniform color appearance of photovoltaic cells or modules might be desired, for example for aesthetic purposes, and it might be desirable to minimize the number of grid lines which may introduce visible non-uniformities.

Finally, an eighth problem in the field of photovoltaic devices is that rectangular or square photovoltaic devices may not always completely cover surfaces containing curves, thereby resulting in overall efficiency loss for a given area. It may therefore be desirable to obtain non-rectangular modules, such as modules designed with features matching the shape of the surface to be covered, so as to maximize the area producing photovoltaic electricity and therefore increasing the overall fill factor.

The invention thus pertains to monolithically-interconnected thin-film photovoltaic devices that, thanks to specific sizing and shaping of the photovoltaic cells and of monolithic interconnects between cells, along with tuning of front-contact layer sheet resistance, can be manufactured with less or no front-contact grids.

In greater detail, the invention provides a thin-film optoelectronic module device comprising at least three optoelectronic components or cells, such as photovoltaic, diode, or light-emitting diode components, that are monolithically interconnected in series and such that when viewed along a viewing axis substantially orthogonal to the optoelectronic surface of said thin-film optoelectronic module device, at least one monolithic interconnect line, delimited by an isolating back-contact groove in the electrically conductive back-contact layer and an isolating front-contact groove in the electrically conductive front-contact layer, represents a curve depicting a spatial periodic or quasi-periodic wave of at least one spatial half-period, the largest peak-to-peak amplitude of which is at least eight times that of the shortest distance between said back-contact groove and said front-contact groove of said monolithic interconnect line and wherein, between a first busbar and a second busbar of the optoelectronic module device, the optoelectronic surface of said thin-film optoelectronic module device presents at least one set of at least three zones of substantially parallel monolithic interconnect lines that each depict a periodic or quasi-periodic wave of at least one spatial half-period having a largest amplitude wave component or (e.g. in the case where a wave of lower amplitude and higher frequency is superimposed on a dominant wave) a baseline largest amplitude wave component of spatial period $\lambda$, said set being visually segregated into: (a) an internal zone comprising at least one monolithic interconnect line which optionally delimits the internal zone and, (b) border zones, between the internal zone and each busbar, each border zone comprising at least one monolithic interconnect line that is substantially parallel to monolithic interconnect lines of said internal zone and where the amplitude of said largest amplitude wave component of at least one said monolithic interconnect line within said border zones is decreased with respect to that of the adjacent monolithic interconnect line that is closer to or comprised in said internal zone, and decreases for each said line that is located closer to the optoelectronic module device's busbar, wherein within the border zones there is a lower front-contact sheet resistance than in the internal zone.

The device may comprise an electrically insulating layer positioned either as a substrate under, or as a superstrate on top of, the following stack of layers (a), (b), (c): namely (a) a front-contact layer comprising at least one first and at least one second electrically conductive front-contact components, said first and second front-contact components being separated by at least one front-contact groove making at least one first front-contact component and at least one second front-contact component that are electrically separate; (b) an absorber layer comprising at least one semiconductive optoelectronically active layer; (c) a back-contact layer comprising at least one first electrically conductive back-contact component and at least one second electrically conductive back-contact component deposited onto said electrically insulating layer wherein said first back-contact component and second back-contact component are separated by at least one back-contact groove making said first back-contact component and second back-contact component electrically separate, thereby realizing a first optoelectronic component and a separate second optoelectronic component each comprising a stack of said front-contact component, at least one said semiconductive layer, and said back-contact component; and such that at least one monolithic interconnection connects at least one of said first front-contact components, passing through said semiconductive layer, with at least one said second back-contact components, thereby realizing a series-interconnection between a first optoelectronic component and a second optoelectronic component.

The device may also comprise at least one said back-contact groove or at least one said front-contact groove that, when viewed along a viewing axis substantially orthogonal to the optoelectronic surface of said thin-film optoelectronic module device represented by at least one monolithic interconnect line, depicts a curve comprising at least one peak of triangular shape.

The device may also comprise at least one said back-contact groove or at least one said front-contact groove that, when viewed along a viewing axis substantially orthogonal to the optoelectronic surface of said thin-film optoelectronic module device, represented by at least one monolithic interconnect line, depicts a curve comprising at least one peak of rounded shape, said peak having a radius of curvature that is less than the peak's width at tenth of maximum amplitude.

The device may further comprise at least one said monolithic interconnect line that comprises at least one additional wave of spatial period smaller than half of that of said largest amplitude wave component.

At least one said monolithic interconnect of the device may be drawn to substantially correspond to a mathematical mapping of at least one other said monolithic interconnect line.

Also, at least one said monolithic interconnect line of the device may be drawn to substantially correspond to a mathematical radial transformation of at least one other said monolithic interconnect line.

The device may further comprise at least one metalized grid component made of at least one metalized trace deposited onto at least one said front-contact component.

More specifically with respect to said monolithic interconnect lines, a line segment comprised within said monolithic interconnect line may be a continuous groove filled with conductive material and substantially parallel to a monolithic interconnect line.

More specifically with respect to said absorber layer, at least one semiconductive photovoltaic layer of the device may be made of Cu(In,Ga)Se$_2$ semiconductor ordinarily referred to as CIGS.

In further detail with respect to said monolithic interconnect lines, a line segment comprised within said monolithic interconnect line may be a segmented line of holes substantially representing a dash pattern that is substantially parallel to the monolithic interconnect line and wherein at least one of said holes comprises a wall made of a copper-rich amorphous metallic compound of solidified CIGS melt stemming from said semiconductive optoelectronically active layer made of CIGS material.

The invention also concerns a method for the design of thin-film optoelectronic module devices comprising at least three series-interconnected optoelectronic components or cells, such as photovoltaic, diode, or light-emitting diode components, the method comprising monolithically interconnecting said components in series such that when viewed along a viewing axis substantially orthogonal to the optoelectronic surface of said thin-film optoelectronic module device, at least one monolithic interconnect line, delimited by an isolating back-contact groove in the electrically conductive back-contact layer and an isolating front-contact groove in the electrically conductive front-contact layer, represents a curve depicting a spatial periodic or quasi-periodic wave of at least one spatial half-period, the largest peak-to-peak amplitude of which is at least eight times that of the shortest distance between said back-contact groove and said front-contact groove of said monolithic interconnect line and wherein, between a first busbar and a second busbar of the optoelectronic module device, the optoelectronic surface of said thin-film optoelectronic module device presents at least one set of at least three zones of substantially parallel monolithic interconnect lines that depict a periodic or quasi-periodic wave of at least one spatial half-period having a largest amplitude wave component or a baseline largest amplitude wave component of spatial period $\lambda$, said set being visually segregated into: (a) an internal zone comprising or delimited by at least one monolithic interconnect line and, (b) border zones, between the internal zone and each busbar, said border zones each comprising at least one monolithic interconnect line that is substantially parallel to monolithic interconnect lines of said internal zone and where the amplitude of said largest amplitude wave component of at least one said monolithic interconnect line within said border zones is decreased with respect to that of the adjacent monolithic interconnect line that is closer to or comprised in said internal zone, and decreases for each said line that is located closer to the optoelectronic module device's busbar providing border zones wherein there is a lower front-contact sheet resistance than in the internal zone; said method further comprising the iterative computation of the number of said cells of said thin-film optoelectronic module device, the width of said cells, and, within at least one border zone over a peak-to-peak half spatial period $\lambda/2$ of said quasi-periodic wave of at least one pair of substantially parallel monolithic interconnect lines, the distance between cells at the divergent and convergent sides of at least one of said wave's peak-to-peak half spatial period.

The method can also comprise for said optoelectronic module device positioning an electrically insulating layer either as a substrate under, or as a superstrate on top of, the following stack of layers (a), (b), (c): namely (a) a front-contact layer comprising at least one first and at least one second electrically conductive front-contact components, said first and second front-contact components being separated by at least one front-contact groove making at least one first front-contact component and at least one second front-contact component that are electrically separate; (b) an absorber layer comprising at least one semiconductive optoelectronically active layer; (c) a back-contact layer comprising at least one first electrically conductive back-contact component and at least one second electrically conductive back-contact component deposited onto said electrically insulating layer wherein said first back-contact component and second back-contact component are separated by at least one back-contact groove making said first back-contact component and second back-contact component electrically separate, thereby realizing a first optoelectronic component and a separate second optoelectronic component each comprising a stack of said front-contact component, at least one said semiconductive layer, and said back-contact component; and such that at least one monolithic interconnection connects at least one of said first front-contact components, passing through said semiconductive layer, with at least one said second back-contact components, thereby realizing a series-interconnection between a first optoelectronic component and a second optoelectronic component.

The method can further comprise computation of at least one dimension that represents a characteristic size of the optoelectronic cells that can be carried out using input values for front-contact sheet resistance, back-contact sheet resistance, initial cell width, and monolithic interconnect line width.

Said computation can also be carried out using at least one repeatable computation of the photovoltaic characteristics of a cell segment model, said cell segment model comprising at least one finite element cell segment.

Furthermore said computation can comprise at least one repeatable computation where photovoltaic conversion efficiency of the thin-film optoelectronic module device is maximized.

The invention's features advantageously solve several problems in the field of monolithically-interconnected thin-film photovoltaic devices, namely:

Said invention reduces or cancels the need for front-contact grids and therefore reduces or cancels the effort needed to design said grids, hence reducing design costs.

Said invention reduces or cancels the manufacturing step needed to deposit a grid onto the front-contact, hence reducing manufacturing complexity and costs.

Said invention reduces or cancels the need for front-contact grids and therefore increases the light-exposed area of the semiconducting photovoltaic layer resulting, for a certain class of photovoltaic modules, in increased module efficiency.

Said invention may increase the manufacturing yield by reducing the number of elements, namely the grid, needed for a photovoltaic module.

Said invention may increase the overall reliability of flexible thin-film photovoltaic devices by reducing or canceling a number of points of failure introduced by the addition of front-contact grids.

Said invention may reduce the number of serially-interconnected cells within a thin-film photovoltaic module and therefore help reduce high voltage problems resulting from the high number of cells in modules that have a large distance between anode and cathode.

BRIEF DESCRIPTION OF FIGURES

Embodiments of the invention will now be described by way of example, with reference to the accompanying drawings, in which:

FIGS. 5A-5B are flowcharts describing a method that can be used to model and design an embodiment of the invention.

DETAILED DESCRIPTION OF SPECIFIC EMBODIMENTS

Figure 1A:
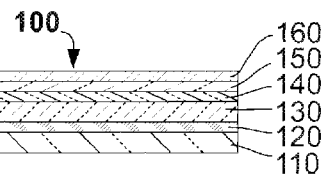
FIG. 1A shows a cross-section of a photovoltaic cell.

FIG. 1A shows an embodiment of a thin-film photovoltaic cell 100. FIG. 1A is represented for explanatory purposes to clarify the layer structure of a typical photovoltaic cell. A sequence of material layers is deposited on a substrate 110. Substrate 110 may be rigid or flexible and be of a variety of materials or coated materials such as glass, coated metal, plastic-coated metal, plastic, or coated plastic such as metal-coated plastic. The inventive method as described is especially advantageous for flexible materials such as plastic, metal, or flexible glass. A preferred flexible substrate material is polyimide as it is very flexible, sustains temperatures required to manufacture high efficiency optoelectronic modules, requires less processing than metal substrates, and exhibits thermal expansion coefficients that are compatible with those of material layers deposited upon it. Industrially available polyimide substrates are ordinarily available in thicknesses ranging from 7 µm to 150 µm. An exemplary sequence of material layer deposition follows. The order of this sequence may be reversed and ordinarily includes scribing operations to delineate cell or module components. The purpose of this initial description is to clarify the context within which the monolithic interconnect design, the main subject of this invention, is executed.

Substrate 110 is ordinarily coated with at least one electrically conductive layer 120. Said electrically conductive layer, or stack of electrically conductive layers, also known as the back-contact, may be of a variety of electrically conductive materials, preferably having a coefficient of thermal expansion (CTE) that is close both to that of the said substrate 110 onto which it is deposited and to that of other materials that are to be subsequently deposited upon it. Conductive layer 120 preferably has a high optical reflectance. In ordinary practice, layer 120 is deposited in a process such as sputtering, electrodeposition, chemical vapor deposition, physical vapor deposition, electron beam evaporation, or spraying and is commonly made of Mo although several other thin-film materials such as metal chalcogenides, molybdenum chalcogenides, molybdenum selenides (such as $MoSe_2$), transition metal chalcogenides, tin-doped indium oxide (ITO), doped or non-doped indium oxides (such as $In_2O_3$), doped or non-doped zinc oxides, zirconium nitrides, tin oxides, titanium nitrides, Ti, W, Ta, and Nb may also be used or included advantageously.

In the next step at least one semiconductive photovoltaic layer 130, also known as the absorber layer, is deposited onto said back-contact. Layer 130 may for example be made of an ABC material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS. Other thin-film absorber materials include CdTe and its variants, amorphous silicon, thin-film silicon, as well as absorber materials used to manufacture dye-sensitized solar cells or organic solar cells. Layer 130 may be deposited using a variety of techniques such as sputtering, electrodeposition, printing, or as a preferred technique for an ABC material, vapor deposition.

The subsequent steps ordinarily include the deposition of substantially transparent layers. In the case of an ABC or a CdTe absorber material, a first layer stack ordinarily includes at least one so-called semiconductive buffer layer 140, ordinarily with an energy bandgap higher than 1.7 eV, for example made of CdS, indium sulfides, zinc sulfides, gallium selenides, indium selenides, tin oxides, zinc oxides, or Zn(O,S) material. For most absorbers the front-contact layer stack ordinarily includes a transparent conductive oxide (TCO) layer 150, for example made of materials such as doped indium oxide, doped gallium oxide, or doped zinc oxide. Further optional steps include the deposition of front-contact metallized grid traces 160 to advantageously augment front-contact conductivity followed by anti-reflective coating ordinarily provided either as a deposited layer or as an encapsulating film.

FIGS. 1B to 4C depict cross-sections and top views of exemplary embodiments of the invention. Someone skilled in the art will appreciate that the scales of the various components represented in the figures have been changed to improve clarity. Furthermore, the number and areas of components in the figures are highly variable and would be scaled up in the framework of an industrial production.

Figure 1B:
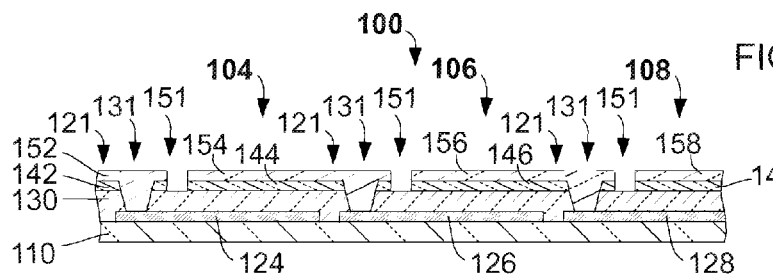
FIGS. 1B-1E show cross-sections of monolithically-interconnected photovoltaic modules.

FIG. 1B shows a cross-sectional cut-out of an embodiment of an extended monolithically interconnected photovoltaic module 100 that comprises three series-interconnected optoelectronic devices 104, 106, 108. Said optoelectronic devices 104, 106, 108 may be photovoltaic devices, diodes, or light-emitting diodes. An embodiment of said photovoltaic module 100 would contain at least two of said optoelectronic devices, preferably several of said optoelectronic devices. In a preferred embodiment said optoelectronic devices are photovoltaic devices, also known as solar cells. The process to manufacture photovoltaic device 100 comprises a sequence of layer deposition steps and scribing steps 121, 131, 151. Electrically insulating substrate 110 is initially coated with electrically conductive back-contact layer 120. Grooves 121 are then cut into back-contact layer 120 so as to expose at least one continuous line of substrate 110, thereby providing a set of back-contact components 124, 126, 128. The process step where grooves 121 are cut is referred to as scribing or patterning step P1. Patterning step P1 may be done using a mechanical scribing blade, preferably using a laser, more preferably using a pulsed laser such as a nanosecond or picosecond laser. In the next step, absorber layer 130 is deposited onto said back-contact components, thereby also filling grooves 121. Deposition of absorber layer 130 may, for some absorber materials such as CIGS or CdTe, be followed by the deposition of buffer layer 140. Grooves or holes 131 are then cut or drilled into layers 130 and, if present, simultaneously through layers 140. The process step where grooves or holes 131 are cut is referred to as scribing or patterning step P2. Patterning step P2 may be done using the same tools as for step P1 but possibly with some adjustments that a person skilled in the art will know how to determine. In case a continuous groove is made, care must be taken not to damage the underlying back-contact components 124, 126, 128. In the next step front-contact layer stack 150 is deposited onto said buffer layer 140 if it is present or said absorber layer 130, thereby filling grooves or holes 131 and establishing an electrically conducting connection between said front-contact layer stack 150 and said back-contact components 124, 126, 128. In scribing step P3, front-contact grooves 151 are then scribed into front-contact layer stack 150 and extend deep enough to expose continuous lines of at least one of said semiconductive layers 130, 140, thereby separating said front-contact layers into electrically disconnected front-contact components 152, 154, 156, 158 and possibly, because buffer layer 140 is ordinarily only a few nanometers thick, into buffer layer components 142, 144, 146, 148. Scribes 121, 131, 151 are ordinarily done as close as possible to each other so as to minimize the area that will subsequently not be available for photovoltaic conversion. The result of the manufacturing process illustrated in FIG. 1B is a photovoltaic module 100 comprising series-interconnected photovoltaic cells 104, 106, 108.

In summary, a monolithic interconnect comprises a front-contact component 154, 156 that is electrically connected via a line 131 of empty or filled holes or grooves 132 to a back-contact component 126, 128 and where each said front- and back-contact components are electrically separated by scribed grooves 151, 121 from respectively adjacent front- and back-contact components.

Figure 1C:
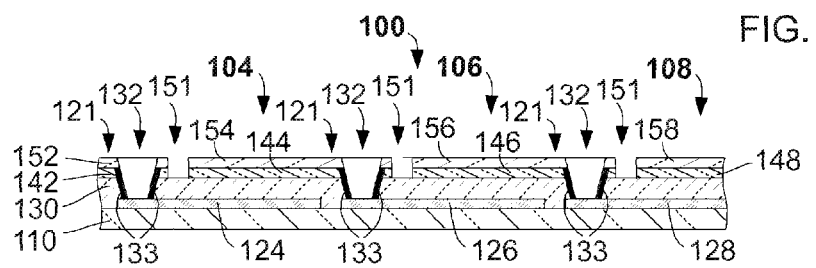

FIG. 1C represents a variation of the embodiment presented in FIG. 1B resulting from a variation of the method described for FIG. 1B. FIG. 1C differs from FIG. 1B in that scribing step P2, resulting in grooves or holes 132, is done after deposition of front-contact layers 150. FIG. 3B or 3C present a top view of a detail of FIG. 1C. Of interest is that the edges 133 of grooves or preferably holes 132 become conductive as a result of heat transfer during the laser scribing process, thereby establishing an electrical path between said front-contact layer stack 150 and said back-contact components 124, 126, 128. For example, in the case of a CIGS-type semiconductive photovoltaic layer, the conductive surface of said grooves or holes 132 is a copper-rich amorphous metallic compound of solidified CIGS melt stemming from the CIGS absorber layer 130. Scribing step P3 of grooves 151 may be conducted before, at the same time, or after scribing step P2. As in FIG. 1B, scribes 121, 131, 151 are done close to each other and the result is a photovoltaic module 100 comprising series-interconnected photovoltaic cells 104, 106, 108.

Figure 1D:
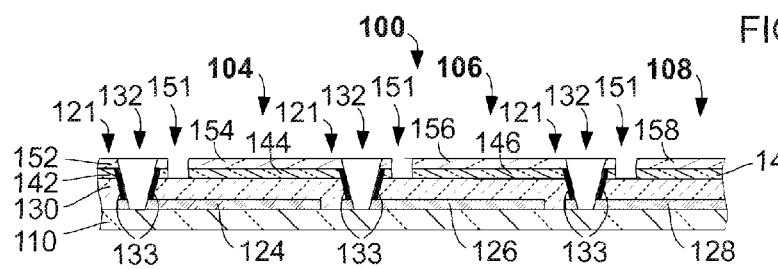

FIG. 1D represents a variation of the embodiment presented in FIG. 1C resulting from a variation of the method described for FIG. 1C. FIG. 3B or 3C also present a top view of a detail of FIG. 1D. FIG. 1D differs from FIG. 1C in that scribing step P2 results in holes 132 that may puncture back-contact layer 120 and therefore back-contact components 124, 126, 136. A benefit of this method is that it may use higher energy scribing lasers and be executed faster than that presented in FIG. 1C. Only holes and not grooves along the module's full width are appropriate for this method. Front-contact to back-contact electrical interconnect is provided by conductive hole edges 133, the properties of which are similar to those of FIG. 1C.

Figure 1E:
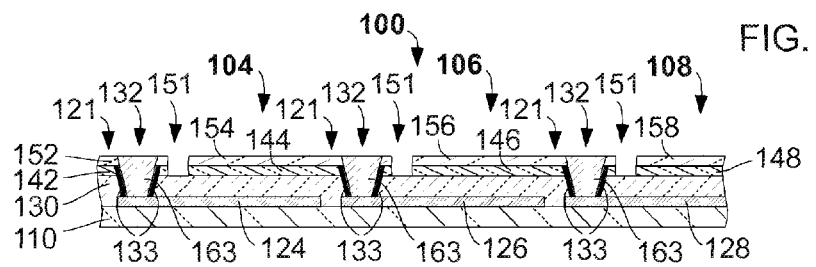

FIG. 1E represents a variation of the embodiment presented in FIG. 1C resulting from a variation of the method described for FIG. 1C. FIG. 1E differs from FIG. 1C in that a conductive paste 163 fills holes or grooves 132 to supplement the electrical conductivity of front-contact to back-contact interconnects provided by conductive hole edges 133. The method presented in FIG. 1E may also be applied to that presented in FIG. 1D so as to also supplement conductivity of conductive hole edges 133.

FIGS. 2A to 2J present the main inventive contribution of the invention: top views of photovoltaic modules comprising narrow photovoltaic cells interconnected by wave-shaped monolithic series-interconnects such as those presented in FIGS. 1B, 1C, 1D, 1E. The shape of the waves traced by the monolithic interconnects may be triangular or smoother such as sine waves or smoothed triangles. Zones 210, 230 may have lower front-contact sheet resistance than zone 220.

Figure 2A:
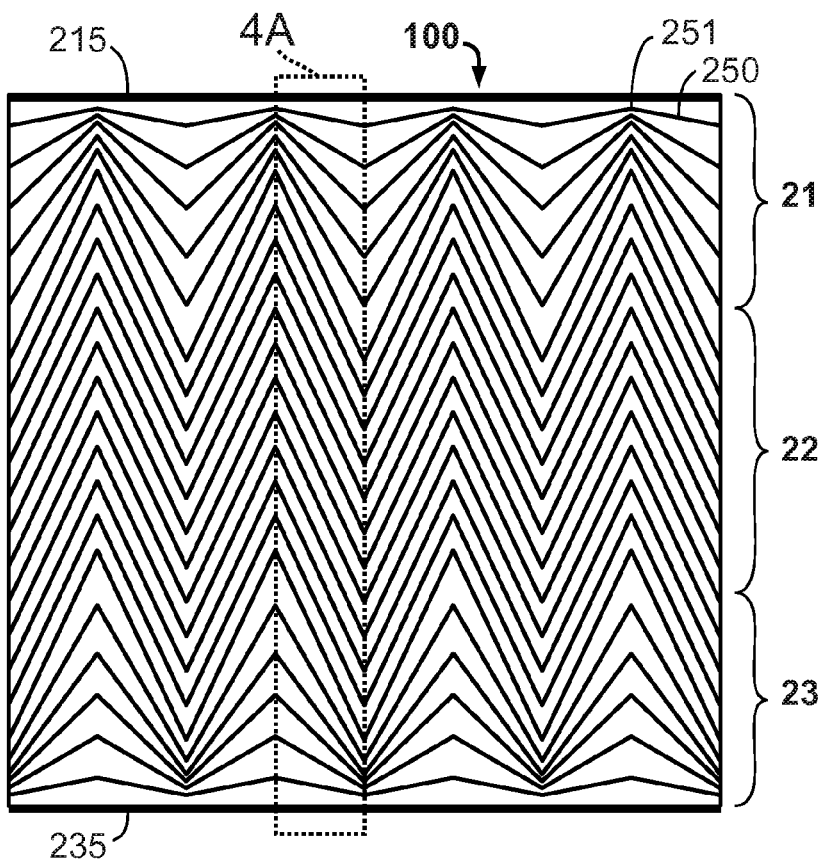
FIGS. 2A-2H show top views of photovoltaic modules comprising monolithically-interconnected cells.

FIG. 2A presents the top view of a photovoltaic module 100 comprising a number of monolithic interconnect lines 250 corresponding in this figure to a triangle waveform. Each monolithic interconnect line 250 should be understood as representing a series monolithic interconnect between adjacent cells such as optoelectronic devices 104, 106, 108 presented in FIGS. 1B, 1C, 1D, 1E. Monolithic interconnect lines 250 can be seen as waveforms that comprise a number of peaks of triangular shape 251. Module 100 comprises 3 zones 210, 220, 230 of monolithic interconnect lines between photovoltaic module busbars 215, 235, ordinarily located at the module's outer edge. In photovoltaic module 100, electrical current therefore flows, for example, from busbar 215 at the end of zone 210 to busbar 235 at end of zone 230. Zone 220 can be understood as an internal zone of module 100 characterized in that the waves drawn by the monolithic interconnect design are of constant amplitude and spatial frequency. Zones 210 and 230 are characterized in that the amplitude of the waves decreases progressively from the outer edge of the internal zone 220 of module 100 to the outer edge of said module. For example, monolithic interconnect lines of zones 210, 230 may derive from conformal or nonconformal mappings of monolithic interconnect lines of zone 220. Waveforms in zones 210, 220, 230 all have the same dominant spatial frequency. It is possible however to conceive waveforms containing additional frequencies along all or part of a given monolithic interconnect line.

Because in zones 210, 230, the distance between monolithic interconnect lines 250 may be greater than optimal, thereby resulting in increased resistance of the front-contact layer, one may decide upon deposition of the front-contact layer 150 to manufacture a layer of lower sheet resistance in zones 210, 230. Lower sheet resistance may for example be obtained by deposition of a thicker front-contact layer in zones 210, 230. For example if in zone 220 the sheet resistance is 30 ohms per square, in zones 210, 230 the sheet resistance may be comprised between 15 and 20 ohms per square. This tuning of sheet resistance may be especially feasible and advantageous for roll-to-roll production of solar modules longer than one meter, depending on front-contact deposition machine technologies.

Figure 2B:
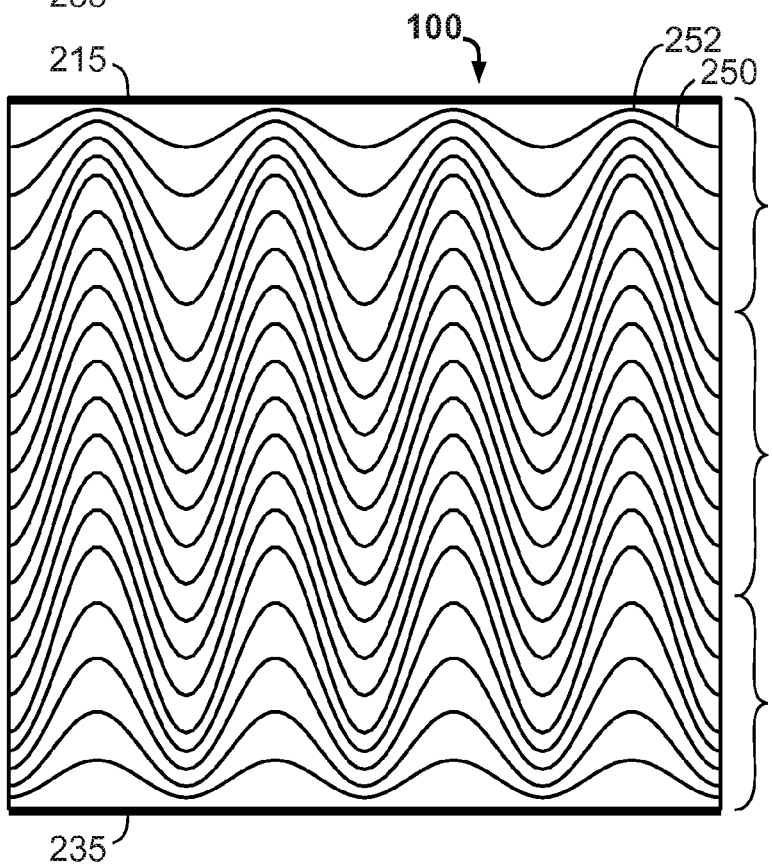

FIG. 2B presents a variation of FIG. 2A where the dominant triangle waveform of FIG. 2A is replaced by a sinusoidal waveform. Monolithic interconnect lines 250 therefore comprise a number of peaks of rounded shape 252. This design, in which the trace of monolithic interconnect lines 250 is smoother than that presented in FIG. 2A, may be advantageous for some manufacturing installations in that the waveform presents no sharp edges and may be easier and faster to manufacture by the scribing laser. A person skilled in the art will infer that other types of smooth curves may be used for said waveform. Similarly to FIG. 2A, zones 210 and 230 are characterized in that the amplitude of the waves decreases progressively from the outer edge of the central zone 220 of module 100 to the outer edge of said module.

Figure 2C:
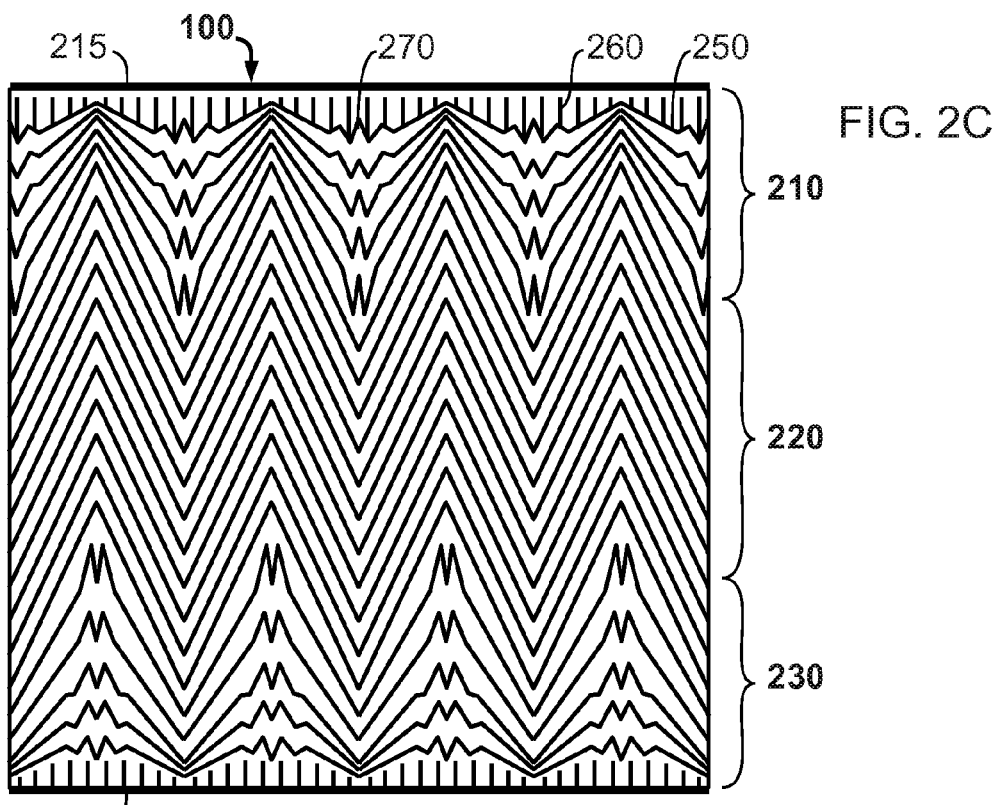

FIG. 2C presents a variation of FIG. 2A where the dominant triangle waveform of FIG. 2A is modified in zones 210 and 230 by adding smaller amplitude waveforms 270, such as triangle waveforms, to the dominant triangle waveform at desirable locations. For example a desirable location is where in FIG. 2A the local distance from one monolithic interconnect line 250 to another is greater than a certain threshold value. This may for example occur at or near the troughs or peaks of wavy monolithic interconnect lines 250 within zones 210 and 230, respectively. Furthermore, conductivity may be increased in some regions with the addition of optional grid lines 260.

Figure 2D:
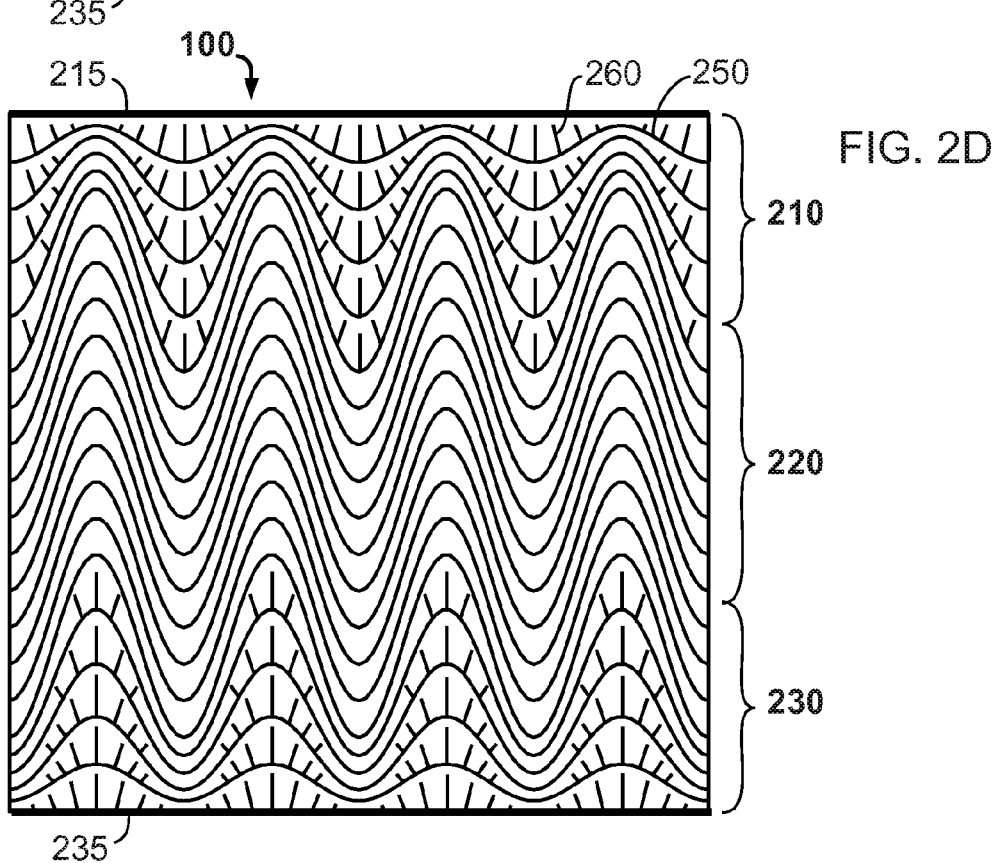

FIG. 2D presents a variation of FIG. 2B where grid lines 260 have been added to some regions where the local distance from one monolithic interconnect line 250 to another is greater than a certain threshold value.

Figure 2E:
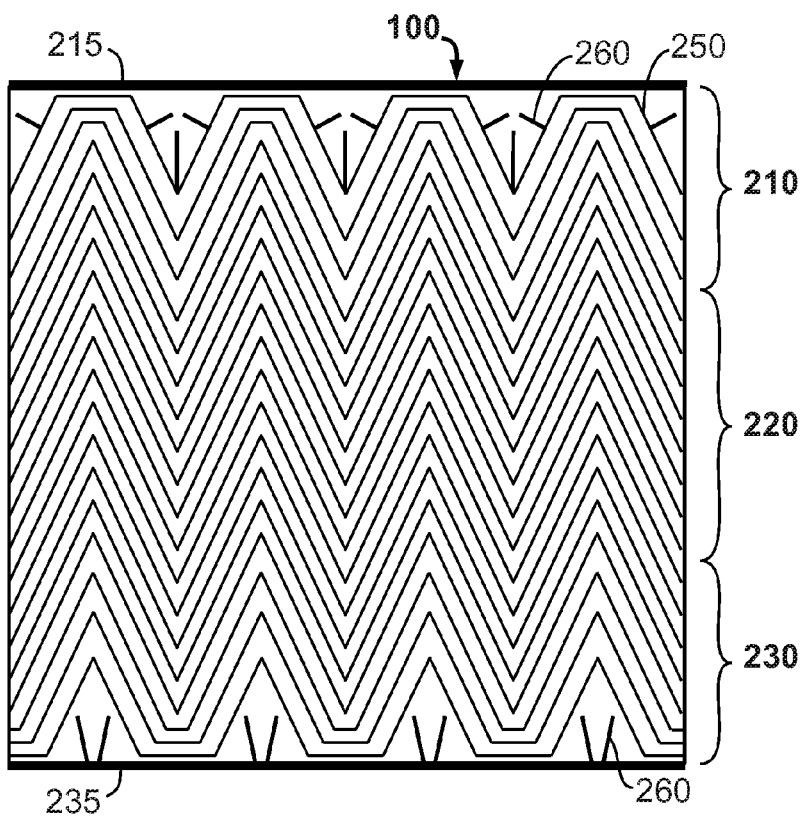

FIG. 2E presents a variation of FIG. 2A where the dominant triangle waveform of FIG. 2A is modified by flattening peaks and troughs of monolithic interconnect lines 250 in zones 210 and 230, respectively.

Figure 2F:
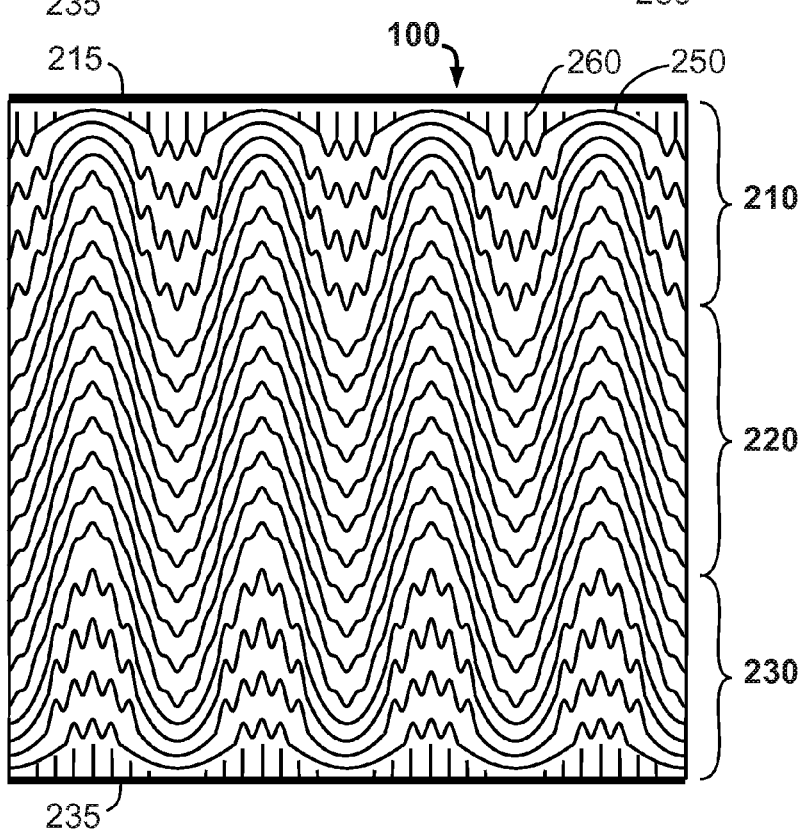

FIG. 2F presents a variation of FIG. 2B where the sinusoidal waveforms of monolithic interconnect lines 250 comprise a dominant frequency and baseline largest amplitude similar to that of monolithic interconnect lines 250 of FIG. 2B and at least one additional frequency of lower amplitude and higher frequency than that of the dominant frequency. Said additional frequency may have different values of amplitude and frequency from one monolithic interconnect line 250 to another. Furthermore, similarly to what is presented in FIG. 2E, peaks and troughs of the dominant and non-dominant frequency waves may be flattened or smoothed, for example to improve the blending of wavy monolithic interconnect lines 250 in the vicinity of anode or cathode edges such as in zones 210 and 230 of photovoltaic module 100. Waves may be smoothed at selected locations such as peaks of the dominant wave component by redesigning interconnect lines to improve blending or, more preferably, by using numerical smoothing methods or filters ordinarily used to smooth signals or data sets. Said smoothing methods or filters may be, for example, local regression methods such as LOESS, low-pass filtering, kernel-based or matrix-based smoothing, Kalman filtering, spline smoothing, Butterworth or Chebyshev filtering, and various digital or numerical filtering methods.

Figure 2G:
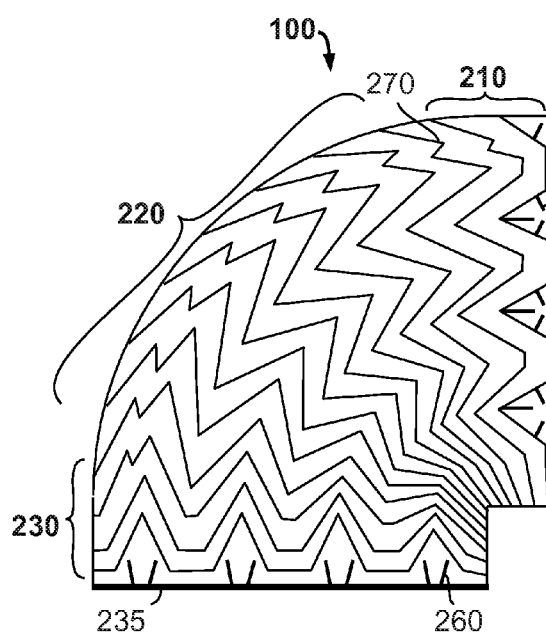

FIG. 2G presents a variation of FIG. 2E where the shape of photovoltaic module 100 is not rectangular and includes at least one curved edge. FIG. 2G illustrates how the design of the dominant waveform of monolithic interconnects 250 can be adapted to a variety of topologies, such as that of an L-shaped photovoltaic module that may be part of an assembly of interconnected photovoltaic modules integrated onto a surface that comprises curved contours. Similarly to FIG. 2E, photovoltaic module 100 comprises three zones 210, 220, 230 of monolithic interconnect lines 250 between photovoltaic module busbars 215, 235. Monolithic interconnect lines 250 are designed as triangle waveforms aligned with radial axes converging approximately towards the center of revolution around which said L-shaped photovoltaic module is designed. Monolithic interconnect lines 250 may therefore be designed to substantially correspond to a mathematical radial transformation of at least one other said monolithic interconnect line 250. To satisfy the maximum distance constraint between lines 250, the amplitude of their waveform increases with distance from said center of revolution around which the L-shaped photovoltaic module is designed. Furthermore, FIG. 2G illustrates the addition of a smaller waveform 270 in regions where the distance between lines 250 would be larger due to divergence of said radial axes. For compatibility with FIG. 2E, FIG. 2G also illustrates the use of optional grid lines 260 to increase front-contact conductivity of areas where the line-to-line distance is greater than the maximum distance constraint between lines 250.

Figure 2H:
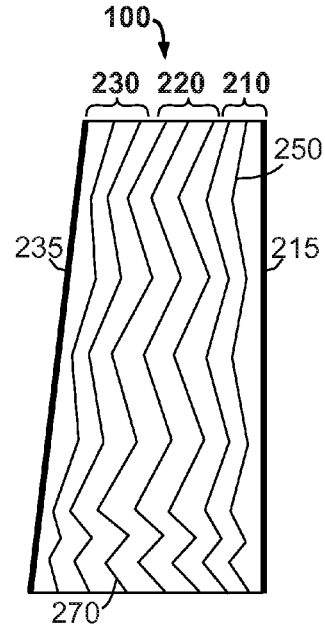

FIG. 2H presents an intermediate variation of FIGS. 2A and 2G where the shape of photovoltaic module 100 is substantially trapezoidal and includes at least one busbar 235 that is not parallel to the opposite busbar 215. Similarly to FIG. 2A, photovoltaic module 100 comprises three zones 210, 220, 230 of monolithic interconnect lines 250 between photovoltaic module busbars 215, 235. Similarly to FIG. 2G, FIG. 2H illustrates the addition of a smaller waveform 270 in regions of the trapezium's long side where the distance between lines 250 is larger. A trapezoidal photovoltaic module may be advantageous to increase coverage of non-rectangular supporting structures.

Figure 2I:
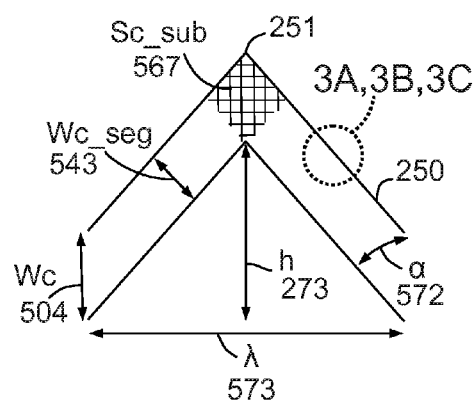
FIGS. 2I-2J represent top views of part of or entire photovoltaic modules used for the description of the design method.

FIG. 2I presents some of the cell and waveform parameters used to trace the invention's monolithic interconnect lines. FIG. 2I represents two partial and parallel monolithic interconnect lines 250 characterized by peaks 251 of triangular shape as represented in FIGS. 2A, 2C, 2E, 2G. Triangular shapes have been chosen only for the figure's clarity and a person skilled in the art will infer that the representation may also apply as an approximation to smooth or rounded waveforms as represented in FIGS. 2B, 2D, 2F with peaks of rounded shape 252. The waveform is characterized by a peak-to-peak height h 273 and a spatial period λ 573. The angle α 572 of the waveform's triangle may also be computed from tan α=λ/2h or, in the case of rounded waveforms, approximated. The distance separating each monolithic interconnect line 250 may be measured as Wc 504 in a direction orthogonal to the waveform's supporting axis or to the direction in which said spatial period λ is measured. Wc_seg 543 is a measure of the separation between two substantially parallel waveform segments and is in practice measured orthogonally to the waveform segment under consideration. Sc_sub 567 is a hatched out region representing the area where the separation between points on a first monolithic interconnect line 250 and a second monolithic interconnect line 250 is suboptimal for photovoltaic conversion and/or electrical transfer.

Figure 2J:
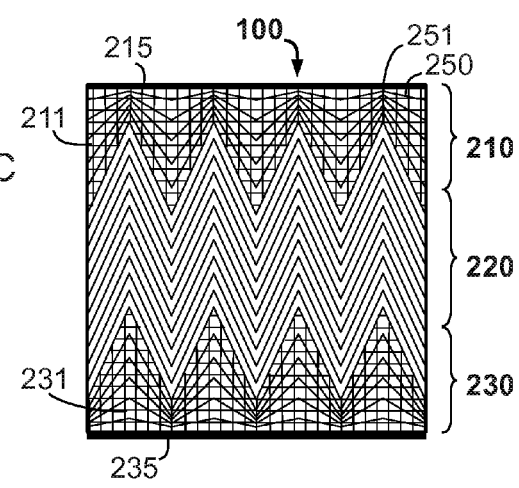

FIG. 2J is a redraw of FIG. 2A where two regions 211, 231 are represented hatched out to designate the fact that photovoltaic conversion and/or electrical transfer is suboptimal in those regions. Regions 211, 231 ordinarily correspond to zones 210, 230, respectively.

Figure 3A:
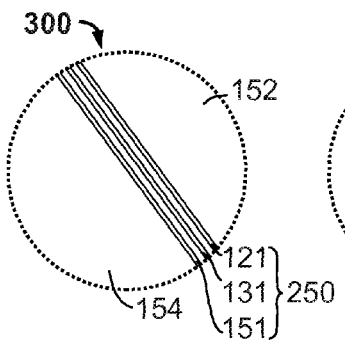
FIGS. 3A-3C represent magnified top views of interconnections within monolithically-interconnected photovoltaic modules.
Figure 3B:
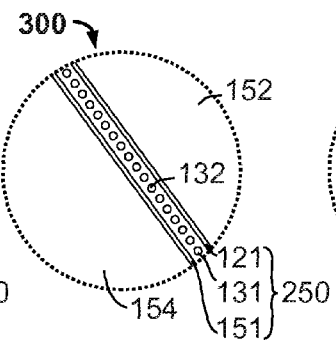
Figure 3C:
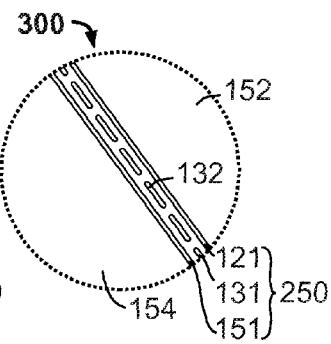

FIGS. 3A, 3B, 3C present simulated magnified top views 300 of straight segments of monolithic interconnect lines 250 comprised in photovoltaic module embodiments presented in FIGS. 1B to 1E and 2A, 2C, 2E, 2G and as specifically indicated in FIG. 2I.

An equivalent magnified top view of monolithic interconnect lines 250 comprised in photovoltaic module embodiments presented in FIGS. 2B, 2D, 2F would present curved segments. Each monolithic interconnect line comprises a set of three scribing traces 121, 131, 151 which correspond to traces 121, 131, 151 in FIGS. 1B to 1E. Because these are top views, front-contact components 152, 154 are also partly visible. Optional front-contact grids are not represented.

FIG. 3A shows two monolithic interconnect lines 250 each comprising three scribing traces 121, 131, 151 as continuous uninterrupted lines. This figure therefore corresponds to cross-sections presented in FIG. 1B, 1C, or 1E.

FIG. 3B is similar to FIG. 3A with the difference that scribing traces 131 are segmented into dot-shaped holes 132. This figure corresponds to cross-sections presented in FIGS. 1B to 1E.

FIG. 3C is similar to FIG. 3B with the difference that scribing traces 131 are segmented into elongated dot- or dash-shaped holes 132. This embodiment with segments or elongated dots may be more advantageous than that presented in FIG. 3B in that traces 131 may be scribed faster.

Figure 4A:
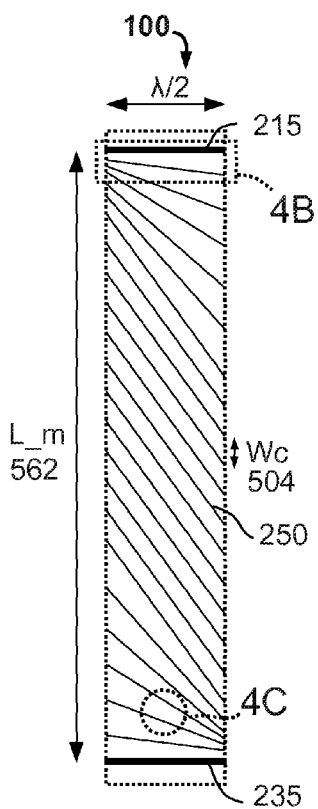
FIGS. 4A-4C represent magnified top view sections of a module's monolithically interconnecting lines to explain the computational process used to design embodiments of the invention.

FIG. 4A presents a cut-out from FIG. 2A and serves to indicate parameters useful to the design of the invention. The cut-out covers a peak-to-peak half spatial period λ/2 of the waveform of a monolithic interconnect line 250. The length L_m 562 of photovoltaic module 100 is defined as cumulated distance from a first busbar 215 to a second busbar 235. In the case of a rectangular photovoltaic module L_m is simply the distance between parallel busbars 215 and 235. In the case of a non-rectangular module cut-out where, for example, busbars 215, 235 are not parallel, the distance L_m may be a cumulative measure of average distances Wc 504 between the supporting lines of the waveforms of adjacent monolithic interconnect lines 250.

Figure 4B:
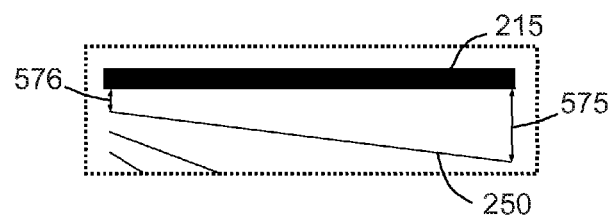
Figure 5B:
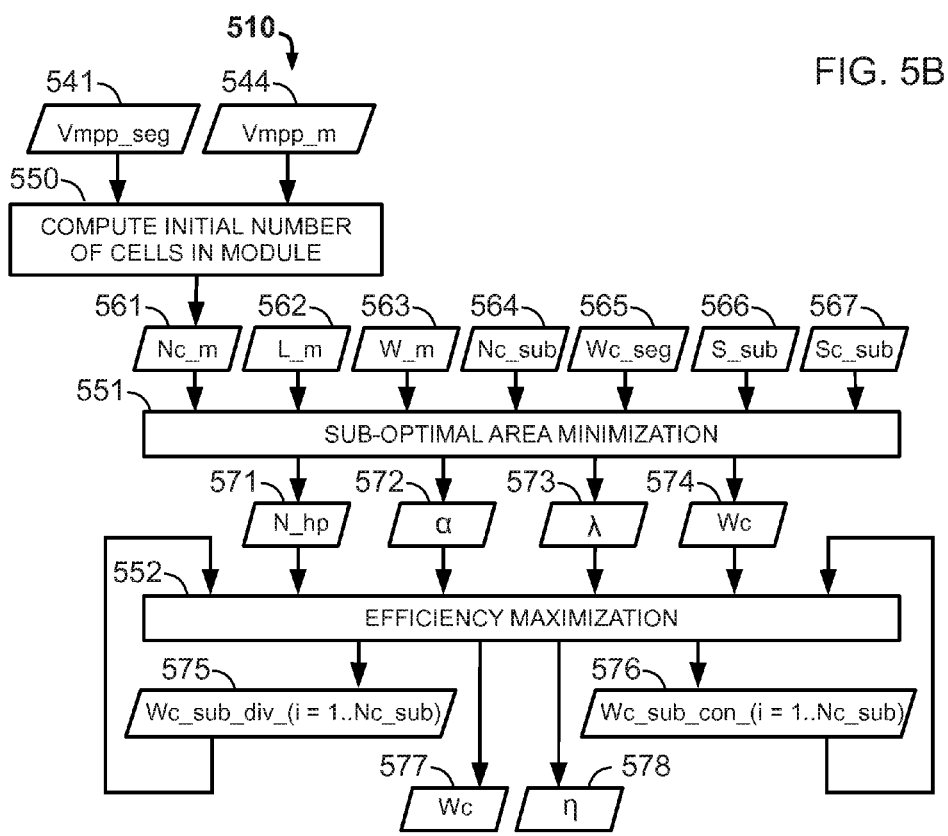

FIG. 4B presents an enlarged cut-out from FIG. 4A and serves to present computation variables mentioned in FIG. 5B. Measure 575 represents the distance Wc_sub_div_1 between adjacent monolithic interconnect lines 250 at the divergent side of a waveform's half-period. In FIG. 4B this measure is shown between first busbar 215 and the first monolithic interconnect line 250. Similarly, 576 represents the distance Wc_sub_con_1 between adjacent monolithic interconnect lines 250 at the convergent side of a waveform's half-period.

Figure 4C:
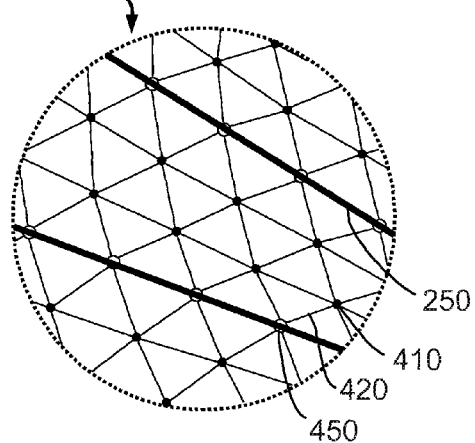

FIG. 4C presents an enlarged cut-out from FIG. 4A and serves to present an example of a finite element mesh 400 used for the computation of the electrical properties of photovoltaic module 100. The mesh comprises monolithic interconnect nodes 450 located on monolithic interconnect lines 250, intra-nodes 410 located between adjacent monolithic interconnect lines 250, and semiconducting finite element mesh segments 420 joining nodes of mesh 400.

FIG. 5A is the first part of a flowchart describing a method that can be used to model and design an embodiment of the invention. The initial parameters comprise front-contact sheet resistance 501, back-contact sheet resistance 502, cell I-V data 503 which ordinarily is obtained from the current vs. voltage curve of a real photovoltaic cell, an initial cell width 504, and a monolithic interconnect line width 505 which ordinarily is a measure of the width of a monolithic interconnect line 250.

A photovoltaic cell 104, 106, 108 is modeled as a set of cell segment models 520. The modeling effort consists in adjusting model variables to approximate cell I-V data 503. A cell segment model 520 may for example extend across a photovoltaic cell from a first monolithic interconnect line to a second monolithic interconnect line. A cell segment model 520 may also be a chain of mesh segments 420 extending from a first monolithic interconnect line 250 to a second monolithic interconnect line 250, as represented in FIG. 4B. A cell segment model 520 is therefore discretized into a number of finite element cell segments 521 which may be modeled by a person skilled in the art as a network of one-diode models that comprise a current generator I_L, a diode D, a shunt resistor R_SH, a front-contact resistor R_FC, and a back-contact resistor R_BC. For example, a cell segment model may be composed of a chain of one hundred finite element cell segments 521. A person skilled in the art will also know how to adjust said one-diode model to represent monolithic interconnect nodes 450.

The maximum power point, photovoltaic efficiency, and photovoltaic efficiency over one year are then computed for cell segment models 520 at steps 531, 532, and 533, respectively. The cell segment width is then incremented at step 537 and computations 520, 531, 532, 533 repeated until reaching a maximum cell segment width 506 at which point the iterative computation branches out through decision 534. An alternative may also be to decrement cell segment width at step 537 until reaching a minimum cell segment width 506 prior to branching out on minimum at decision 534. This is followed by a selection of the cell segment width with maximum photovoltaic efficiency at step 535, thereby producing a maximum efficiency cell segment width Wc_seg 543, and followed further by a computation of I-V characteristics for the selected cell segment width at step 536, thereby producing a cell segment's voltage value at maximum power point Vmpp_seg 541 and a cell segment's current value at maximum power point Impp_seg 542.

FIG. 5B is the second part of the flowchart in FIG. 5A. It uses result Vmpp_seg 541 from FIG. 5A and desired module voltage value at maximum power point Vmpp_m 544 to compute, for example with a simple division, the initial number of cells in module Nc_m 561 at computational step 550. Further parameters comprise the length of the module L_m 562, measured from busbar 215 to busbar 235, the width of the module W_m 563, the number of cells Nc_sub 564 in the suboptimal regions 211, 231, the separation Wc_seg 565 between waveform segments, the surface S_sub 566 of the suboptimal regions 211, 231, and the surface Sc_sub 567 of the suboptimal hatched out region described in FIGS. 2I, 2J. Step 551 represents that of a first minimization of the sub-optimal area in suboptimal regions 211, 231. The minimization process is ordinarily iterative and starts with a preliminary design where cells in suboptimal regions 211, 231, of zones 210, 230, have a surface that is larger by a ratio Rc_sub, preferably where Rc_sub=0.07 (7 percent), than cells in internal zone 220. An example of the computation follows:

$$Wc = L\_m/(Nc\_m + Rc\_sub \times 2 \times Nc\_sub),$$

$$Wc\_seg = Cw \times (1 + Rc\_sub),$$

$$h = Nc\_sub \times Wc,$$

$$\alpha = \arcsin(Wc\_seg/Wc),$$

$$\lambda/2 = h \times \tan(\alpha),$$

$$N\_hp = \mathrm{Round}(W\_m/\lambda/2),$$

$$\lambda/2 = h/N\_hp,$$

$$\alpha = \arctan(\lambda/2/h),$$

$$Wc\_seg = Wc \times \sin(\alpha),$$

where W_m is module width, N_hp is number of half periods.

A photovoltaic efficiency maximization computation for module 100 then takes place at step 552 using results N_hp 571, α 572, λ 573, and Wc 574. Said efficiency maximization uses a mesh, for example a triangular mesh as represented in FIG. 4C, and an iterative finite-element optimization method to maximize the photovoltaic efficiency η 578 of module 100. A person skilled in the art knows than many design parameters can be adjusted using a variety of numerical optimization methods. FIG. 5B therefore lists only the most important set of values output by said second optimization 552, namely: result 575 Wc_sub_div_(i=1 . . . Nc_sub) representing the distance between adjacent monolithic interconnect lines 250 at the divergent side of a waveform's half-period for cells 1 to Nc_sub comprised within regions 211, 231, as illustrated in FIGS. 4B and 2J; result 576 Wc_sub_con_(i=1 . . . Nc_sub) representing the distance between adjacent monolithic interconnect lines 250 at the convergent side of a waveform's half spatial period for cells 1 to Nc_sub comprised within regions 211, 231, as illustrated in FIGS. 4B and 2J; result 577 Wc which may be an adjusted value for result 574 Wc resulting from step 551.

Advantages of the Invention

The exemplary embodiments represented in the present disclosure offer a number of advantages for the manufacture of monolithically interconnected modules and especially the manufacture of a class of flexible monolithically interconnected modules. Such monolithically interconnected modules may comprise series-interconnected optoelectronic devices that are connected together in series, parallel, or a combination of both.

A main first advantage of the invention results from the absence of front-contact grid lines or at least from a reduction in the area where front-contact grid lines are needed when compared to conventional monolithically interconnected modules composed of rectangular photovoltaic cells or optoelectronic devices.

A second advantage is cost reduction. This cost reduction results from the reduction or canceling of the effort needed to design said grids.

A third advantage is the reduction or canceling of some manufacturing steps. This manufacturing simplification results from the reduction or canceling of the effort needed to deposit a grid onto the front-contact.

A fourth advantage is, for a class of photovoltaic modules, increased module efficiency. This efficiency increase results from an increase in the light-exposed area of the semiconducting photovoltaic layer.

A fifth advantage is an increase in manufacturing yield. This yield increase results from a reduction in the number of elements, namely a reduction or suppression of grid elements, needed for a photovoltaic module.

A sixth advantage is an increase in overall reliability of flexible thin-film photovoltaic devices. This increased reliability results from a reduction in the number of points of failure introduced by the addition of front-contact grids on flexible photovoltaic devices.

A seventh advantage is that, compared to thin-film photovoltaic modules comprising uniformly straight cells, the module's voltage may be decreased thanks to a reduction in the number of serially-interconnected cells.

An eighth advantage is that, compared to photovoltaic devices featuring visible front-contact grid lines, devices manufactured according to the invention may contain no or fewer front-contact grid lines and therefore present a more uniform appearance that may be more pleasing esthetically.

A ninth advantage is that, compared to photovoltaic devices based on straight line monolithic interconnects or more generally to rectangular-shaped photovoltaic devices, devices manufactured according to the invention may provide improved electrical properties for photovoltaic devices featuring curved contours.

A tenth advantage is that, compared to rectangular photovoltaic devices, devices manufactured according to the invention enable increased coverage of non-rectangular surfaces featuring curved or oblique contours, thereby maximizing the area producing photovoltaic electricity and increasing the fill factor of the overall photovoltaic installation.

The invention claimed is:

1. A thin-film optoelectronic module device, comprising
a first busbar contacting a first border zone;
a second busbar contacting a second border zone;
an internal zone disposed between the first border zone and the second border zone;
a back-contact layer including a plurality of back-contact grooves that are spaced apart in a first direction;
a front-contact layer including a plurality of front-contact grooves that are spaced apart in the first direction;
a plurality of interconnects, each interconnect positioned in the first direction between one of the plurality of back-contact grooves and one of the front-contact grooves; and
an array of at least four optoelectronic cells interconnected in a series that extends in the first direction from the first busbar to the second busbar, each optoelectronic cell connected to another optoelectronic cell in the series by one of the plurality of interconnects, and each optoelectronic cell comprising:
a portion of the back-contact layer separated from other portions of the back-contact layer by at least one of the back-contact grooves;
a portion of the front-contact layer separated from other portions of the front-contact layer by at least one of the front-contact grooves; and
an absorber layer disposed between the portion of the back-contact layer and the portion of the front-contact layer;
wherein:
each interconnect of the plurality of interconnects has a shape of a periodic wave;
a largest peak-to-peak amplitude of at least one interconnect of the plurality of interconnects is at least eight times greater than a shortest distance between the back-contact groove and the front-contact groove that the at least one interconnect is positioned between;
the first border zone, the second border zone and the internal zone each include one or more of the interconnects;
the one or more of the interconnects of the internal zone are substantially parallel to the one or more interconnects of each of the first and second border zones;
a largest amplitude of at least one wave component of at least one of the one or more interconnects in each of the first or second border zones is lesser than a smallest amplitude of at least one wave component of at least one of the one or more interconnects in the internal zone; and
the front-contact layer of each of the first and second border zones has a lower sheet resistance than a sheet resistance of the front-contact layer of the internal zone.

2. The device, according to claim 1, wherein at least one of the plurality of interconnects has a shape of a curve comprising at least one peak having a triangular shape.

3. The device, according to claim 1, wherein at least one of the plurality of interconnects has a shape of a curve comprising at least one peak having a rounded shape, said peak having a radius of curvature that is less than the peak's width at one tenth of a maximum amplitude of the peak.

4. The device, according to claim 1, wherein at least one of the plurality of interconnects comprises at least one wave portion having a spatial period smaller than half of that of said largest amplitude wave component of the at least one of the plurality of interconnects.

5. The device, according to claim 1, further comprising at least one metalized grid component made of at least one metalized trace deposited onto the front-contact layer.

6. The device, according to claim 1, wherein a line segment comprised within at least one of the plurality of interconnects is a continuous groove filled with conductive material and is substantially parallel to an adjacent interconnect.

7. The device, according to claim 1, wherein the absorber layer is made of $Cu(In,Ga)Se_2$.

8. The device, according to claim 1, wherein a line segment comprised within at least one of the plurality of interconnects is a series of holes substantially arranged in a dash pattern, and wherein at least one of said holes comprises a wall made of a copper-rich amorphous metallic compound of solidified CIGS melt.

9. A thin-film optoelectronic module device, comprising:
a first busbar;
a second busbar;
an electrically conductive front-contact layer;
an electrically conductive back-contact layer;
at least six optoelectronic components or cells that are monolithically interconnected in a series that extends in a first direction from the first busbar to the second busbar, wherein each optoelectronic component or cell comprises:
  a portion of the electrically conductive back-contact layer formed over a surface of a substrate,
  a portion of the electrically conductive front-contact layer, and
  a portion of an absorber layer comprising at least one semiconductive optoelectronically active layer, wherein the absorber layer is disposed between the portion of the electrically conductive back-contact layer and the portion of the electrically conductive front-contact layer;
a plurality of monolithic interconnect lines, each monolithic interconnect line electrically connecting one of the optoelectronic components or cells to an adjacent optoelectronic component or cell that is next in the series in the first direction, and each monolithic interconnect line comprising:
  an isolating back-contact groove that separates the portion of the electrically conductive back-contact layer of one of the optoelectronic components or cells from the portion of the electrically conductive back-contact layer in the adjacent interconnected optoelectronic component or cell,
  an isolating front-contact groove that separates the portion of the electrically conductive front-contact layer of one of the optoelectronic components or cells from the portion of the electrically conductive front-contact layer in the adjacent optoelectronic component or cell, and
  a conductive material disposed between the isolating back-contact groove and the isolating front-contact groove to electrically connect the electrically conductive front-contact layer of one of the optoelectronic components or cells to the electrically conductive back-contact layer of the adjacent optoelectronic component or cell;
wherein at least one monolithic interconnect line of the plurality of monolithic interconnect lines is formed to include a spatial periodic wave of at least one spatial half-period, and a largest peak-to-peak amplitude of the wave is at least eight times that of a shortest distance between the back-contact groove and the front-contact groove of the at least one monolithic interconnect line;
an internal zone comprising a plurality of the at least six optoelectronic components or cells that are separated by substantially parallel monolithic interconnect lines of the plurality of monolithic interconnect lines that each have a periodic wave of at least one spatial half-period; and
two border zones that each comprise a plurality of the at least six optoelectronic components or cells that are separated by substantially parallel monolithic interconnect lines of the plurality of monolithic interconnect lines that each have a periodic wave of at least one spatial half-period, wherein one border zone is disposed between the first busbar and the internal zone and one border zone is disposed between the second busbar and the internal zone, and
wherein a front-contact layer sheet resistance of each of the portions of the electrically conductive front-contact layer in the border zones is less than a front-contact layer sheet resistance of each of the portions of the electrically conductive front-contact layer in the internal zone.

10. The thin-film optoelectronic module device of claim 9, wherein
at least one of the monolithic interconnect lines in each border zone is substantially parallel to at least one of the monolithic interconnect lines in the internal zone,
the periodic wave of each of the monolithic interconnect lines in the internal zone and the border zones have at least one peak, wherein the periodic wave extends in a second direction that is perpendicular to the first direction, and
a spacing in the first direction between adjacent peaks of two adjacent substantially parallel monolithic interconnect lines within each of the border zones is less than a spacing in the first direction between adjacent peaks of two adjacent substantially parallel monolithic interconnect lines within the internal zone.

11. The thin-film optoelectronic module device of claim 10, wherein a spacing between adjacent peaks in adjacent substantially parallel monolithic interconnect lines within the border zones decreases for each adjacent monolithic interconnect line in a direction extending from the internal zone to the first busbar or in a direction extending from the internal zone to the second busbar.

* * * * *